United States Patent [19]

Orchard-Webb

[11] Patent Number: 5,684,390
[45] Date of Patent: Nov. 4, 1997

[54] ACTIVE SEMICONDUCTOR DEVICE WITH MATCHED REFERENCE COMPONENT MAINTAINED IN BREAKDOWN MODE

[75] Inventor: Jonathan Orchard-Webb, Kanata, Canada

[73] Assignee: Mitel Corporation, Kanata, Canada

[21] Appl. No.: 583,114

[22] PCT Filed: Jul. 13, 1994

[86] PCT No.: PCT/CA94/00378

§ 371 Date: May 9, 1996

§ 102(e) Date: May 9, 1996

[87] PCT Pub. No.: WO95/02859

PCT Pub. Date: Jan. 26, 1995

[30] Foreign Application Priority Data

Jul. 16, 1993 [CA] Canada ................................. 2100727

[51] Int. Cl.[6] .................................................. G05F 1/575
[52] U.S. Cl. .................................. 323/281; 323/280
[58] Field of Search ........................... 323/273, 280, 323/281

[56] References Cited

U.S. PATENT DOCUMENTS

| | | | |
|---|---|---|---|
| 3,970,875 | 7/1976 | Leehan | 307/304 |
| 4,158,804 | 6/1979 | Butler et al. | 323/281 |
| 4,260,946 | 4/1981 | Wheatley, Jr. | 323/314 |
| 4,581,672 | 4/1986 | Lucero | 323/224 |
| 4,716,307 | 12/1987 | Aoyama | 323/281 |
| 4,731,574 | 3/1988 | Melbert | 323/275 |
| 5,355,078 | 10/1994 | Demizu | 323/281 |
| 5,548,205 | 8/1996 | Monticelli | 323/274 |

FOREIGN PATENT DOCUMENTS

| | | | |
|---|---|---|---|
| 214899 | 3/1987 | European Pat. Off. | G05F 1/46 |
| 2292280 | 6/1976 | France | G05F 3/24 |
| 2146145 | 4/1985 | United Kingdom | G05F 1/46 |

Primary Examiner—Jeffrey L. Sterrett
Attorney, Agent, or Firm—Marks & Clerk

[57] ABSTRACT

A method of improving the performance of an active semiconductor device with a voltage-controllable channel length, comprises providing a matched reference component having similar operating characteristics to the active semiconductor device, continually monitoring the breakdown voltage of the matched reference component, and maintaining the operating voltage of the active semiconductor device to lie just below the measured breakdown voltage of the matched reference component. In this way, the performance of the active component can be optimized.

10 Claims, 1 Drawing Sheet

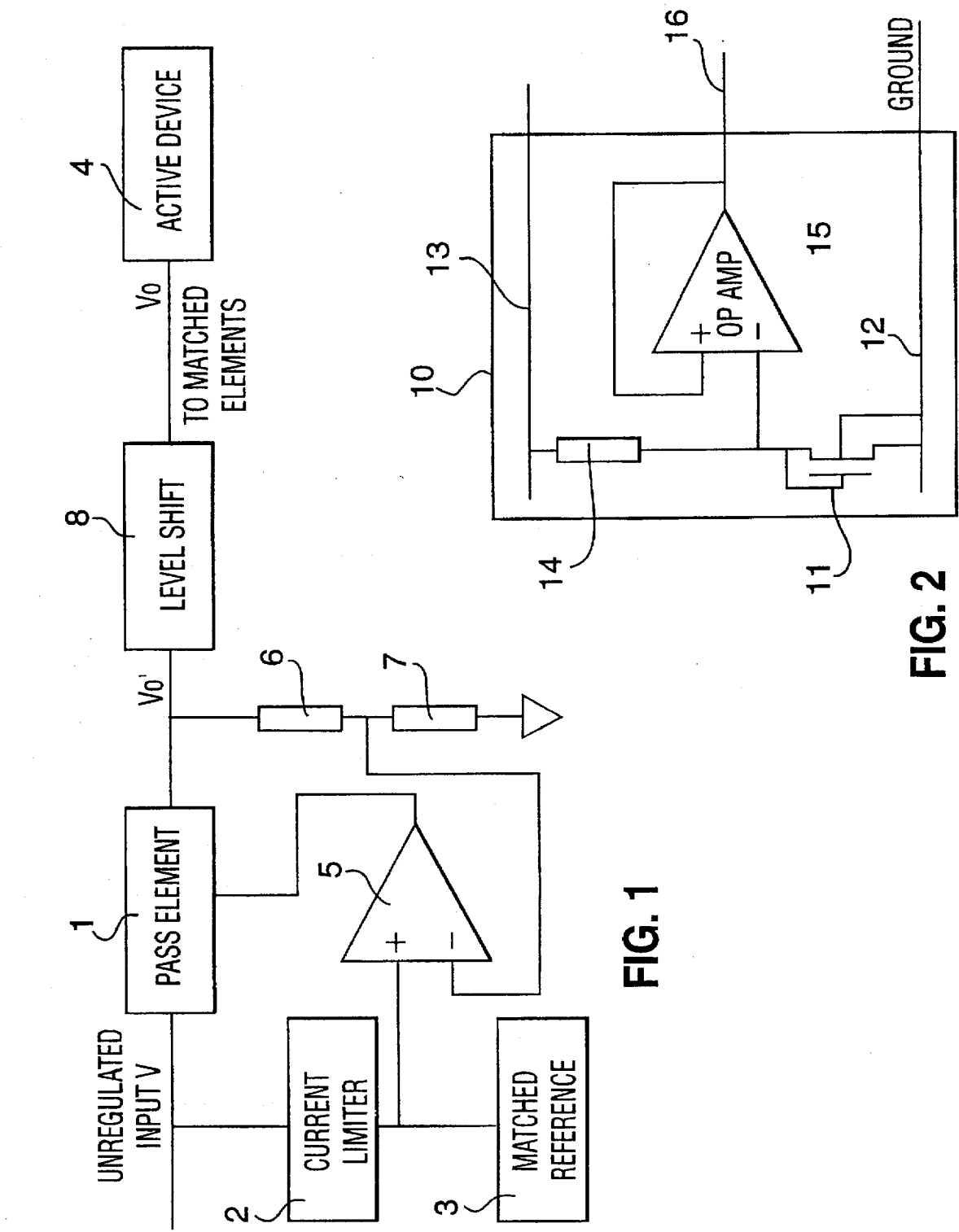

ACTIVE SEMICONDUCTOR DEVICE WITH MATCHED REFERENCE COMPONENT MAINTAINED IN BREAKDOWN MODE

FIELD OF THE INVENTION

This invention relates to an optimization circuit for use with an active semi-conductor device, such as a MOS or CMOS field effect transistor circuit.

DESCRIPTION OF THE PRIOR ART

A wide range of gate lengths is observed in advanced CMOS and GaAs devices due to process variations over long periods of time. This gives rise to a wide range in electrical parameters, particularly speed and breakdown voltage. Analagous problems occur in bipolar devices, where base width is difficult to control.

As a result of the spread of breakdown voltages from one device to the next, it is customary to design circuitry to operate well away from the breakdown voltage so that the circuit specifications do not result in a significant wastage of components and reduction in product yield. The unfortunate consequence of this requirement is that the operating frequency of the circuit is reduced. The reduction in operating frequency is compounded by the Early effect, which causes the frequency response to decrease as the supply voltage is moved further away from the breakdown voltage.

Previously, guard banding has been employed to distance the circuit operating conditions from the minimum breakdown voltage but inevitably speed performance is adversely affected. There is a trade-off between performance and reject rate. The smaller the guard band, the better the performance but the higher the reject rate. In the production of any semi-conductor device, the objective is to obtain the lowest reject rate, or highest yield, possible.

GB 2 146 145 describes an internal high voltage regulator for integrated circuits, which includes matched components that are designed to breakdown first in the event of an excessive internal programming voltage, thereby protecting the operating circuitry. This patent does not disclose how to optimize the performance of a circuit.

The object of the invention is to alleviate the aforementioned problems.

SUMMARY OF THE INVENTION

In accordance with the present invention, there is provided a method of improving the performance of an active semiconductor device with a voltage-controllable channel length, comprising providing a matched reference component having similar operating characteristics to said active semiconductor device, characterized in that a current is supplied to said matched reference component to cause the breakdown thereof, the breakdown voltage of said matched reference component is continually monitored, and the operating voltage of said active semiconductor device is continually maintained to lie just below the voltage at which breakdown occurs.

The invention can be applied to any electrical circuit which has well matched active components. In the case of discrete components, the operating voltage can be set by a linear voltage control circuit comprising an amplifier and a power transistor forming a pass element. The function of the pass element is to reduce the voltage to a value of $V_o$ below the reference device breakdown voltage. In the case of a bipolar circuit, the same technique can be used or an operational amplifier can be used to buffer the reference voltage, with the required voltage drop being obtained from a level shifting circuit.

The reference device is preferably maintained in close physical proximity on the same circuit to the active device. As a result, the reference component is influenced by the same external factors as the active component and consequently its breakdown voltage varies in a similar fashion.

In one embodiment, a small current is forced through the reference component with a current limiting device to cause it to breakdown, and the breakdown voltage is then presented to an input of an operational amplifier, which at its output provides a control voltage.

In a further aspect, the invention provides an optimization circuit comprising an active semiconductor device having a channel with an identifiable breakdown voltage, a voltage regulator for applying a desired output voltage to said device, said output voltage determining the length of said channel, and a matched reference component having similar operating characteristics to said active device, characterized in that it further comprises means for supplying current to said matched reference component to cause it to break down, means for continually monitoring the breakdown voltage of said matched reference component, and means for adjusting the voltage applied to said active device by said voltage regulator to maintain the output voltage of said device at a level just below below the voltage at which breakdown occurs.

The described circuit has the advantage that each semiconductor device is operated as close as possible to the optimum breakdown voltage without actually causing breakdown. As a result, regardless of processing variations, the circuit will always operate very close to the maximum possible speed.

BRIEF DESCRIPTION OF THE DRAWINGS

The invention will now be described in more detail, by way of example only, with reference to the accompanying drawings, in which:

FIG. 1 is a generalized block diagram of an optimization circuit in accordance with the invention; and FIG. 2 shows a circuit detail of an alternative embodiment, in which the reference device is designed to breakdown at a voltage lower than the active circuit devices so as to eliminate the need for a pass element.

DESCRIPTION OF THE PREFERRED EMBODIMENTS

Referring now to the FIG. 1, an unregulated input voltage V is applied to a pass element 1 and current limiter 2. The current limiter 2 forces a small current through matched reference component 3, causing it to break down. The matched reference component 3 is chosen to have operating characteristics as close as possible to an active channel device 4, such as a CMOS FET. The matched component 3 is also placed in close physical proximity to the device 4 so as to be influenced by the same external factors. The matched reference component therefore behaves in the same manner as the active device 4.

The breakdown voltage of the matched reference component 3 is continually presented to a non-inverting input of operational amplifier 5 having an inverting input connected to the mid-point of a potential divider formed by resistors 6, 7. The output of operational amplifier 5 is connected to the output of pass element 1.

The operational amplifier 5 is connected as a voltage regulator in which the potential divider can be adjusted to set the voltage Vo' to be close to the matched reference voltage. Level shifter 8 then sets the voltage drop to a value Vo, which is just below the breakdown voltage of the frequency limiting circuitry.

FIG. 2 shows an alternative implementation of the optimization circuit.

The reference circuit, generally designated 10, comprises a reference MOS FET 11 connected in series with a load 14, which may be a resistor or MOS transistor, for supplying a small current to the reference MOS FET 11. The reference MOS FET 11 has a channel length $L=L_a-\delta$, where $L_a$ is the critical channel length at which breakdown occurs of the critical transistors in the active circuit, i.e. normally the smallest channel length permitted for the process used and $\delta$ is a small increment in the order of 10% $L_a$. For a MOS device, the small reduction in channel length $\delta$ ensures that the reference device breaks down at a slightly lower voltage than the active circuit devices. This arrangement eliminates the need for a pass element or level shifting circuit, but the matching characteristics still remain very good. Operational amplifier 15 has transistors with a channel length $L>L_a$.

In operation, the active circuit has a first set of non-critical transistors (not shown) that are operated with channel lengths L such that $L>L_a$, and these transistors are supplied by the external supply 13. A second set of critical transistors (not shown) are operated with channel lengths $L_a$, and these are supplied by the output 16 of the operational amplifier 15, which has one input connected to the reference MOSFET 11.

The above circuit ensures that regardless of processing variations, the circuitry will always operate very close to the maximum speed possible.

I claim:

1. A method of improving the performance of an active semiconductor device with a voltage-controllable channel length, comprising the steps of:
   a) providing a matched reference component having similar operating characteristics to said active semiconductor device;
   b) continually supplying a current to said matched reference component to cause the breakdown thereof;
   c) continually monitoring the breakdown voltage of said matched reference component; and
   d) continually maintaining the operating voltage of said active semiconductor device just below said breakdown voltage.

2. A method as claimed in claim 1, wherein said matched reference component is located in close physical proximity to said active semiconductor device so as to be influenced by the same external factors as the active semiconductor device.

3. A method as claimed in claim 1, wherein said breakdown voltage is presented to an operational amplifier as a reference voltage, and said operational amplifier produces an output voltage that sets an output voltage of the active semiconductor device at a desired level just below its breakdown voltage.

4. A method as claimed in claim 1, wherein said reference component is designed to breakdown at a voltage slightly lower than the active semiconductor device.

5. An optimization circuit comprising:
   a) an active semiconductor device having a channel with an identifiable breakdown voltage and a length determined by an applied operating voltage;
   b) a matched reference component having similar operating characteristics to said active device;
   c) means for continually supplying current to said matched reference component to cause the breakdown thereof;
   d) means for continually monitoring the breakdown voltage of said matched reference component; and
   e) means for adjusting said applied voltage to maintain the operating voltage of said device at a level just below said breakdown voltage.

6. An optimization circuit as claimed in claim 5, characterized in that said matched component is located in close physical proximity to said semiconductor device so as to be influenced by the same external factors as said active semiconductor device.

7. An optimization circuit as claimed in claim 6, wherein said means for adjusting said applied voltage comprises an operational amplifier having a first input connected to said matched reference component and a second input receiving a signal proportional to said applied voltage.

8. An optimization circuit as claimed in claim 7, wherein said second input of said operational amplifier is connected to a potential divider receiving said applied reference voltage.

9. An optimization circuit as claimed in claim 5, wherein said active semiconductor device is a CMOS device.

10. An optimization circuit as claimed in 5, wherein said matched reference device is designed to break down at a voltage slightly lower than said active semiconductor device.

* * * * *